United States Patent
Voo

(10) Patent No.: US 7,289,381 B1
(45) Date of Patent: Oct. 30, 2007

(54) PROGRAMMABLE BOOSTING AND CHARGE NEUTRALIZATION

(75) Inventor: Thart Fah Voo, Singapore (SG)

(73) Assignee: Marvell International Limited (BM)

( * ) Notice: Subject to any disclaimer, the term of this patent is extended or adjusted under 35 U.S.C. 154(b) by 29 days.

(21) Appl. No.: 11/285,903

(22) Filed: Nov. 23, 2005

Related U.S. Application Data

(60) Provisional application No. 60/692,073, filed on Jun. 20, 2005.

(51) Int. Cl.
*G06G 7/00* (2006.01)

(52) U.S. Cl. .................................. 365/205; 365/236

(58) Field of Classification Search ............... 327/205, 327/236, 252, 253
See application file for complete search history.

(56) References Cited

U.S. PATENT DOCUMENTS

| 5,796,647 | A | * | 8/1998 | Iizuka et al. | 708/801 |
| 6,853,231 | B2 | * | 2/2005 | Millar | 327/236 |
| 6,982,582 | B1 | * | 1/2006 | Cheng | 327/205 |

* cited by examiner

*Primary Examiner*—Vu A. Le

(57) ABSTRACT

A programmable capacitance circuit including an input node; an output node; and a plurality of capacitance stages. Each of the capacitance stages is coupled to the input node and the output node, and wherein each capacitance stage is configured to be switched into a circuit path between the input node and the output node. Each of the capacitance stages includes a capacitor, and a control transistor having a gate capacitance in series with the capacitor, wherein the gate capacitance is configured to be added to the capacitance of the capacitor between the input node and the output node.

29 Claims, 7 Drawing Sheets

Couple Programmable Capacitance Circuit Across First and Second Voltage Nodes of a Circuit, wherein the Nodes are Amplification Nodes of an Amplifier Circuit

500

Switch at Least One Capacitance Stage of the Programmable Capacitance Circuit into a Circuit Path Across the Nodes, wherein the Capacitance of the Switched Capacitance Stage Includes the Gate Capacitance of a Transistor and the Capacitance of a Capacitor

PROGRAMMABLE BOOSTING AND CHARGE NEUTRALIZATION

CROSS-REFERENCES TO RELATED APPLICATIONS

This application claims priority to U.S. Provisional Patent Application No. 60/692,073, filed Jun. 20, 2005, titled "Programmable Boosting and Charge Neutralization," and is incorporated by reference herein in its entirety.

BACKGROUND OF THE INVENTION

The present invention generally relates to circuits, and more particularly relates to a programmable integrated circuit having programmable capacitance.

A variety of circuits include programmable capacitance for tuning the circuits and/or for filtering. One example of a circuit typically including programmable capacitance is an amplifier that includes a feedback loop across one or more of the amplifier stages of the amplifier. FIG. 1 is a simplified schematic of a three stage amplifier 100 having a programmable capacitance circuit 105 that is configured to feedback an amplified signal across two of the amplification stages. Programmable capacitance circuit 105 may be used for a variety tuning purposes, such as reducing the bandwidth degradation from parasitic capacitance on the amplifier, for example, for high frequency amplification applications. The variable capacitor may also be used to compensate for parasitic circuit variation due to process variation between circuits. Further, the programmable capacitance circuit may be used to tune the feedback for a variable gain amplifier, wherein gain changes cause a set feedback capacitance to become unstable. Specifically, the feedback capacitor may be turned to stabilize this capacitive instability.

FIG. 2 is a further detailed schematic of programmable capacitance circuit 105, which includes a number of capacitance stages 110a-110n that are configured to be switched into the feedback loop. Note that reference nodes "A" in FIGS. 1 and 2 are matching nodes, and that reference nodes "B" in these figures are matching nodes. Each capacitance stage includes a capacitor 115 and a transistor 120. Each transistor, e.g., transistor 120a, is configured to switch its associated capacitance stage, e.g., 110a, and its associated capacitor, e.g., 115a, into the feedback loop to tune the capacitive feedback of the amplifier. One drawback of programmable capacitance circuit 105 is that transistors 120a-120n are typically relatively large so that the source-drain capacitance of these transistors (i.e., the capacitance of the transistors in series with the capacitors 115a-115n) approximately matches the capacitance of capacitors 115a-115n.

Therefore, new circuits are needed that provide programmable capacitance and are configured to compensate for process variations, variable gain amplification, variable parasitic capacitance and the like.

BRIEF SUMMARY OF THE INVENTION

Embodiments of the present invention provide a programmable capacitance circuit configured to tune the capacitance of a circuit, such as an amplifier circuit. A specific embodiment of the programmable capacitance circuit includes code for controlling a plurality of capacitance stages, wherein each of the capacitance stages is coupled to the input node and the output node, and wherein each capacitance stage is configured to be switched by the code into a circuit path between an input node and an output node of the programmable capacitance circuit. Each capacitance stage includes a control transistor controlled by the code and having a gate capacitance in series with the capacitor. The gate capacitance is configured to be added to the capacitance of the capacitor between the input node and the output node.

According to a specific embodiment of the code, the control transistor of each capacitance stage includes a first source-drain node coupled to a voltage source, a second source-drain node coupled to a first node of the capacitor, and a gate node coupled to the input node. The capacitor of each capacitance stage includes a second node coupled to the output node. The code further includes code for controlling a current source, wherein each capacitance stage further includes a set of switches coupled to the current source and controlled by the code to selectively route the current to turn on an associated one of the control transistors. Each set of switches includes a pair of switches in series between the current source and ground, and a current-control transistor including i) a gate node coupled to a node between the pair of switches, ii) a first source-drain node coupled to the second source-drain node of the control transistor and to the first node of the capacitor, and iii) a second source-drain node coupled to ground. Each current-control transistor of each capacitance stage is configured to turn on the control transistor of the capacitance stage if the current-control transistor is turned on by the current source. The code further includes code for controlling a shunt transistor configured to shunt current from the current source to ground if each pair of switches is open. The shunt transistor includes a gate node and a first source-drain node coupled to the current source, and a second source-drain node coupled to ground. The input node and the output node are configured to be coupled across one or more amplification stages of a multi-stage amplifier. One or more of the capacitors have the same capacitance. Alternatively, the capacitors have different capacitances. The gate capacitance of each control transistor of each capacitance stage is substantially the same as the capacitance of the capacitor of the capacitance stage. The capacitor of each capacitance stage is coupled between the control transistor of the capacitance stage and the output node.

According to another embodiment, a programmable capacitance circuit includes input means, output means, and a plurality of capacitance stage means, wherein each of the capacitance stage means is coupled to the input means and the output means. Each capacitance stage means is configured to be switched into a circuit path between the input means and the output means. Each capacitance stage means includes a capacitance means, and a control means having a gate capacitance in series with the capacitance means, wherein the gate capacitance is configured to be added to the capacitance of the capacitance means between the input means and the output means.

According to a specific embodiment of the programmable capacitance circuit, the control means of each capacitance stage includes a first source-drain node coupled to a voltage source, a second source-drain node coupled to a first node of the capacitor, and a gate node coupled to the input means. The capacitance means of each capacitance stage means includes a second node coupled to the output means.

According to another specific embodiment, the programmable capacitance circuit further includes a current source, wherein each capacitance stage means further includes a set of switch means coupled to the current source and configured to selectively route the current to turn on an associated one of the control means. Each set of switch means includes a pair of switches in series between the current source and ground, and a current-control means including i) a gate node coupled to a node between the pair of switches, ii) a first source-drain node coupled to the second source-drain node of the control means and to the first node of the capacitance means, and iii) a second source-drain node coupled to ground. Each current-control means of each capacitance stage means is configured to turn on the control means of the capacitance stage means if the current-control means is turned on by the current source.

According to another specific embodiment, the programmable capacitance circuit further includes a shunt means configured to shunt current from the current source to ground if each pair of switches is open. The shunt means includes a gate node and a first source-drain node coupled to the current source, and a second source-drain node coupled to ground. The input means and the output means are configured to be coupled across one or more amplification stages of a multi-stage amplifier. One or more of the capacitance means have the same capacitance. Alternatively, the capacitance means may have different capacitances. The gate capacitance of each control means of each capacitance stage means is substantially the same as the capacitance of the capacitance means of the capacitance stage. The capacitor means of each capacitance stage means is coupled between the control means of the capacitance stage means and the output means.

According to another embodiment, code for controlling a programmable circuit includes code for controlling an amplifier having a set of amplifier stages; and code for controlling a programmable capacitance circuit having a plurality of capacitance stages coupled across at least one of the amplifier stages, wherein each capacitance stage is configured to be switched into a circuit path across the at least one amplifier stage, and wherein each capacitance stage includes a capacitor, and a control transistor having a gate capacitance in series with the capacitor.

According to a specific embodiment of the code, the capacitance across the at least one amplifier stage is the gate capacitance plus the capacitance of the capacitor added serially. The control transistor of each capacitance stage includes a first source-drain node coupled to a voltage source, a second source-drain node coupled to a first node of the capacitor, and a gate node coupled a first voltage node of the amplifier. The capacitor of each capacitance stage includes a second node coupled to a second voltage node of the amplifier. A first voltage at the second voltage node is an amplified voltage of a second voltage at the first voltage node. The at least one stage is configured to amplify the first voltage to the second voltage.

According to a another specific embodiment, the code includes code for controlling a current source, wherein each capacitance stage further includes a set of switches configured to selectively route the current to turn on an associated one of the control transistors. Each set of switches includes a pair of switches in series between the current source and ground, and a current-control transistor including i) a gate node coupled to a node between the pair of switches, ii) a first source-drain node coupled to the second source-drain node of the control transistor and to the first node of the capacitor, and iii) a second source-drain node coupled to ground. Each current-control transistor of each capacitance stage is configured to turn on the control transistor of the capacitance stage if the current-control transistor is turned on by the current source.

According to another specific embodiment, the code includes code for controlling a shunt transistor configured to shunt current from the current source to ground-if each current-control transistor of each capacitance stage is off. The shunt transistor includes a gate node and a first source-drain node coupled to the current source, and a second source-drain node coupled to ground. One or more of the capacitors have the same capacitance. Alternatively, the capacitors may have different capacitances. The gate capacitance is substantially the same as the capacitance of the capacitor.

According to another embodiment, code for controlling a programmable circuit includes code for coupling a programmable capacitance circuit across first and second voltage nodes of a circuit. The first and second voltage nodes have different voltages. The code further includes code for switching at least one capacitance stage of the programmable capacitance circuit into a circuit path across the first and second voltage nodes. Wherein the capacitance of the at least one capacitance stage includes the gate capacitance of a transistor and the capacitance of a capacitor. The gate capacitance of the transistor and the capacitance of the capacitor is series capacitance. At least one of the first and second voltage nodes is an amplifier node of an amplifier having a plurality of amplifier stages.

According to another embodiment, a programmable circuit includes means for coupling a programmable capacitance means across first and second voltage nodes of a circuit means, wherein the first and second voltage nodes have different voltages. The programmable circuit further includes means for switching at least one capacitance stage means of the programmable capacitance means into a circuit path across the first and second voltage nodes. The capacitance of the at least one capacitance stage means includes the gate capacitance of a transistor and the capacitance of capacitance means. The gate capacitance of the transistor and the capacitance of the capacitance means is series capacitance. At least one of the first and second voltage nodes is an amplifier node of an amplifier means having a plurality of amplifier stage means.

A better understanding of the nature and advantages of the present invention may be gained with reference to the following detailed description and the accompanying drawings.

BRIEF DESCRIPTION OF THE DRAWINGS

FIG. 5 is a high-level flow chart having steps for tuning the capacitance of a programmable capacitance circuit.

DETAILED DESCRIPTION OF THE INVENTION

The present invention generally provides a circuit, and more specifically provides a programmable capacitance circuit.

Figure 1:
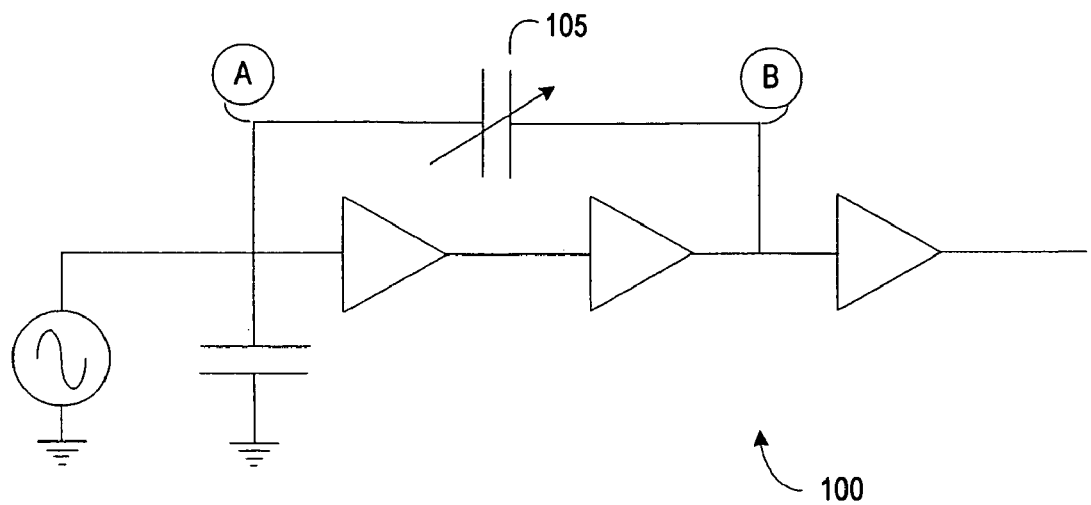
FIG. 1 is a simplified schematic of a three stage amplifier having a programmable capacitance circuit that is configured to feedback an amplified signal across two of the amplification stages of the amplifier.
Figure 2:
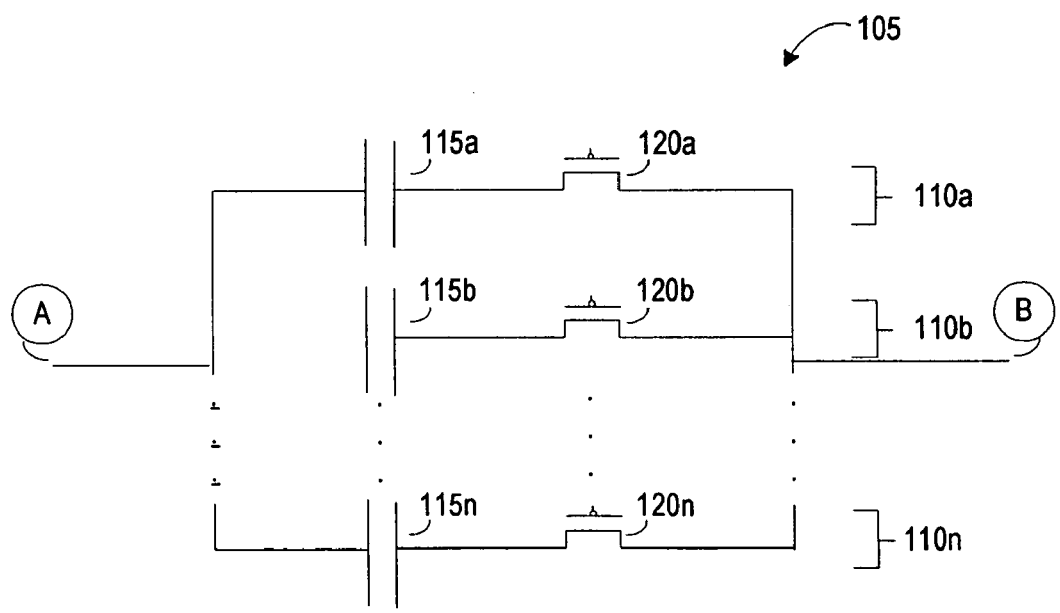
FIG. 2 is a simplified schematic of a traditional programmable capacitance circuit that includes a number capacitance stages that are configured to be switched into the feedback loop via as set of transistors respectively associated with the capacitance stages.
Figure 3:
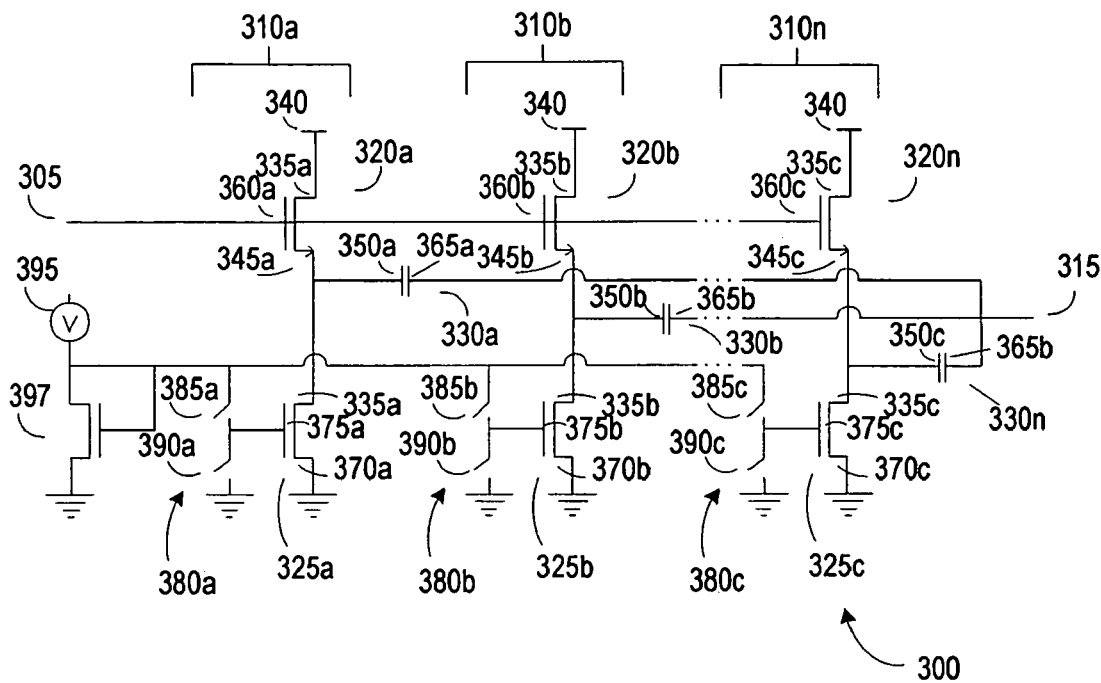
FIG. 3 is a simplified schematic of a programmable capacitance circuit according to one embodiment of the present invention.

FIG. 3 is a simplified schematic of a programmable capacitance circuit 300 according to one embodiment of the present invention. Programmable capacitance circuit 300 includes an input node 305, a plurality of programmable capacitance stages 310, and an output node 315. The capacitance stages are labeled with the base reference numeral 310 and alphabetic suffixes a-n, wherein "n" represents a number that may be determined based on a particular application for which the programmable capacitance circuit is intended. For example, the number of capacitance stages may be determined based available die area, the fineness of tuning desired, the magnitude of tuning desired and/or the like. The capacitance of the programmable capacitance circuit across the input node and the output node may be varied as is presently described in detail.

According to one embodiment, programmable capacitance circuit 300 includes a plurality of control transistors 320, a plurality of current-switch transistors 325, and a plurality of capacitors 330. Each control transistor, each current-switch transistor, and each capacitor is labeled with its associated base reference numeral and an alphabetic suffix, i.e., 320a-320n, 325a-325n, and 330a-330n. For clarity, in a given capacitance stage, the control transistor, the current-switch capacitor, and the capacitor in the given capacitance stage are referred to herein as being associated. For example, control transistor 320a, current-switch transistor 325a, and capacitor 330a in capacitance stage 310a are referred to as being associated. Capacitors 330a-330n may have the same capacitances values and/or different capacitances values.

According to one embodiment, a first source-drain node 335 of each control transistor is coupled to a "high-voltage" node 340, e.g., VCC. A second source-drain node 345 of each control transistor is coupled to a first node 350 of its associated capacitor and to a first source-drain node 355 of its associated current-control transistor. A gate node 360 of each control transistor may also be coupled to input node 305. A second node 365 of each capacitor may be coupled to output node 315. A second source-drain node 370 of each current-control transistor may be coupled to a "low-voltage" node, e.g., ground. The voltage of the high-voltage nodes is higher than the voltage of the low-voltage node.

A gate node 375 of each current-control transistor may be coupled to a set of current-control switches 380, which may include a first current-control switch 385 and a second current-control switch 390. Each of the first current-control switches 385 may be coupled to a current source 395. The current source may also be coupled to a shunt transistor 397 that may be configured to shunt current from the current source to ground if, for example, each of the first current-control switches is open. More specifically, the current source may be coupled to both a first source-drain node and a gate node of the shunt transistor to both control the shunt transistor and drive current through a second source-drain node to ground. According to one embodiment, the first and second-control switches may be configured to be opened and/or closed to turn on or turn off one or more of the current-control transistors.

According to one embodiment, if a given current-control transistor is turned on via its associated set of current-control switches, e.g., current-control transistor 325a, then control transistor 320a associated with current-control transistor 325a will also be effectively turned on, and capacitor 330a will be switched into the circuit path between the input node and the output node. Moreover, the capacitance of control transistor 320a between the gate node and the second source-drain node (referred to herein as the gate capacitance) will also be switched into the circuit path between the input node and the output node. The gate capacitance and the capacitance of the capacitor add serially. While the foregoing description describes one of the capacitors 330 being switched into the circuit path between the input node and the output node, it will be understood that one or more sets of the current-control switches may be configured to turn on one or more of the current-control transistors to switch one or more capacitors into the circuit path between the input node and output node. Switching one or more of the capacitors into the circuit path between the input node and the output node effects capacitive tuning of programmable capacitance circuit 300.

Figure 4:
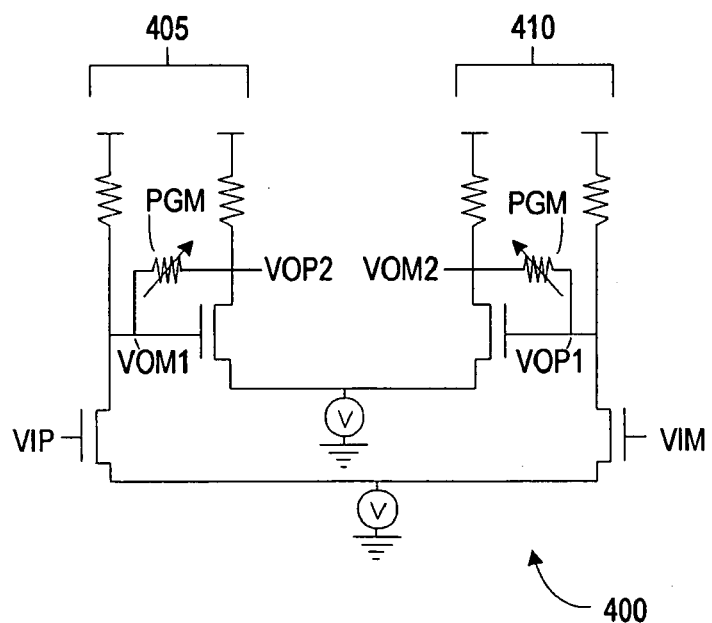
FIG. 4 is a simplified schematic of an exemplary multi-stage amplifier having a first amplifier stage and a second amplifier stage across which one or more programmable capacitance circuits may be coupled according to one embodiment of the present invention.

According to various applications of the present invention, one or more programmable capacitance circuits 300 may be respectively coupled across one or more amplifier stages of an amplifier circuit. FIG. 4 is a simplified schematic of an exemplary multi-stage amplifier 400 having a first amplifier stage 405 and a second amplifier stage 410 across which one or more programmable capacitance circuits may be coupled according to one embodiment of the present invention. For example, the input node and the output node of a first programmable capacitance circuit 300 may be respectively coupled across nodes VOP2 and VOM1 of the first amplifier stage, and the input node and the output node of a second programmable capacitance circuit 300 may be respectively coupled across nodes VOM2 and VOP1 of the second amplifier stage. According to a further embodiment, the output node of the first mentioned programmable capacitance circuit may also (or alternatively) be coupled to node VIP of the amplifier, and the output node of the second mentioned programmable capacitance circuit may also (or alternatively) be coupled to node VIM of the amplifier. The foregoing described application of two programmable capacitance circuits 300 in an amplifier circuit is described for exemplary purposes. Those of skill in the art will know of a variety circuits in with one or more programmable capacitance circuits 300 may be used. These circuits and their associated programmable capacitance circuits are to be considered part of the presently described invention and the appended claims where appropriate.

FIG. 5 is a high-level flow chart having steps for tuning the capacitance of programmable capacitance circuit 300. It should be understood that the steps of the described high-level flow are exemplary and that various steps may be substituted with alternative steps, steps may be combined, and/or steps may be eliminated without deviation from the embodiment represented by the high-level flow chart. In an initial step 500, a programmable capacitance circuit is coupled across first and second voltage nodes of a circuit. The first and second voltage nodes are at different voltages, and may be amplification nodes of an amplifier circuit, such as the amplifier circuit shown in FIG. 4. In a step 510, at least one capacitance stage of the programmable capacitance circuit is switched into a circuit path across the first and second voltage nodes. The capacitance of each capacitance stage includes the gate capacitance of a transistor and the capacitance of a capacitor. The gate capacitance of the transistor and the capacitance of the capacitor is series capacitance (i.e., these capacitances add serially).

Figure 6A:
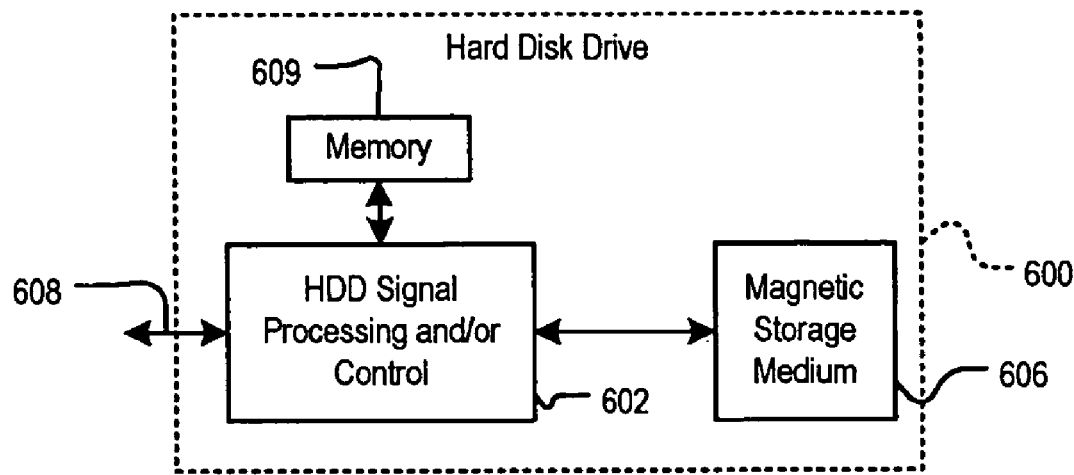
FIGS. 6A-6H are simplified schematics of various exemplary implementations of the present invention.

Referring now to FIGS. 6A-6G, various exemplary implementations of the present invention are shown. Referring to FIG. 6A, the present invention may be embodied in a hard disk drive 600. The present invention may implement in either or both signal processing circuits and/or control circuits, which are generally identified in FIG. 6A at 602. In some implementations, signal processing and/or control circuit 602 and/or other circuits (not shown) in HDD 600 may process data, perform coding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM) and/or other suitable electronic data storage.

Figure 6B:
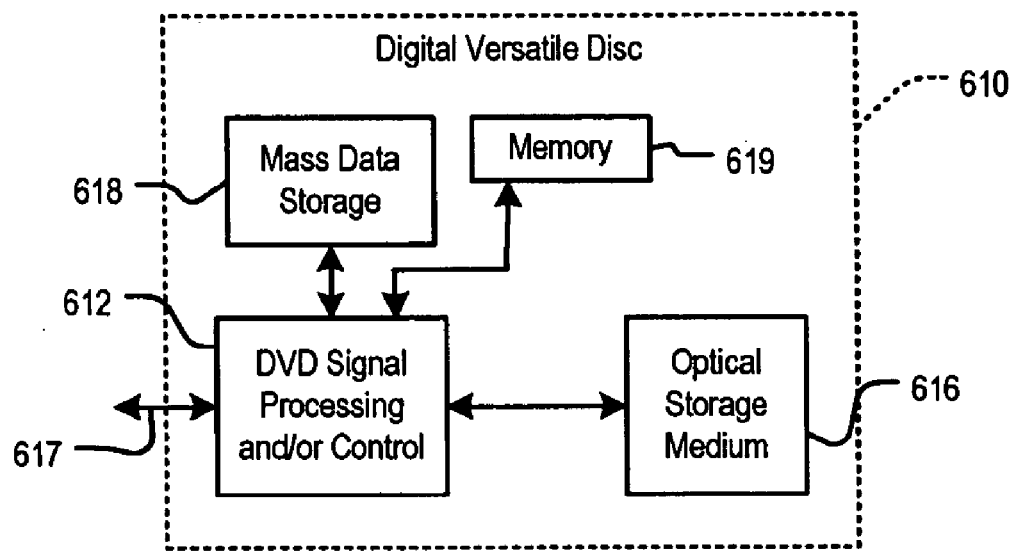

Referring now to FIG. 6B, the present invention may be embodied in a digital versatile disc (DVD) drive 610. The present invention may implement either or both signal processing and/or control circuits, which are generally identified in FIG. 6B at 612, and/or mass data storage 618 of DVD drive 610. Signal processing and/or control circuit 612 and/or other circuits (not shown) in DVD 610 may process data, perform coding and/or encryption, perform calculations, and/or format data that is read from and/or data written to an optical storage medium 616. In some implementations, signal processing and/or control circuit 612 and/or other circuits (not shown) in DVD 610 can also perform other functions such as encoding and/or decoding and/or any other signal processing functions associated with a DVD drive.

DVD drive 610 may communicate with an output device (not shown) such as a computer, television or other device via one or more wired or wireless communication links 617. DVD 610 may communicate with mass data storage 618 that stores data in a nonvolatile manner. Mass data storage 618 may include a hard disk drive (HDD) such as that shown in FIG. 6A. The HDD may be a mini HDD that includes one or more platters having a diameter that is smaller than approximately 1.8". DVD 610 may be connected to memory 619, such as RAM, ROM, low latency nonvolatile memory such as flash memory, and/or other suitable electronic data storage.

Figure 6C:
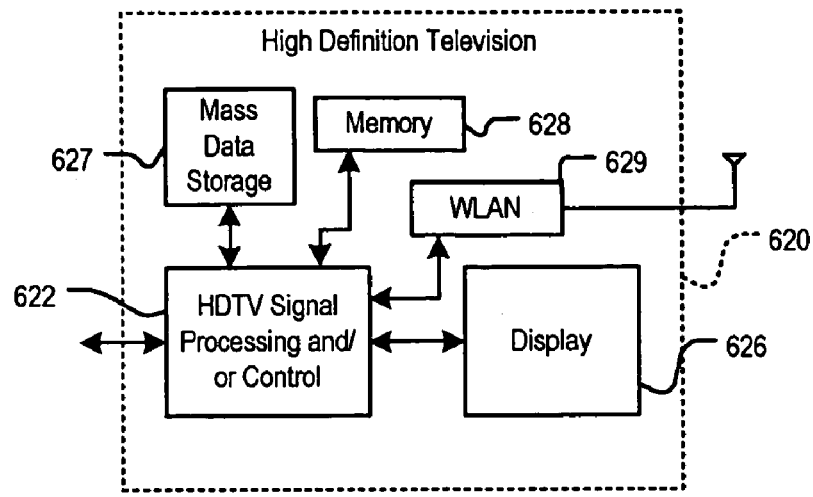

Referring now to FIG. 6C, the present invention may be embodied in a high definition television (HDTV) 620. The present invention may implement either or both signal processing and/or control circuits, which are generally identified in FIG. 6C at 622, a WLAN interface and/or mass data storage of the HDTV 620. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 6D:
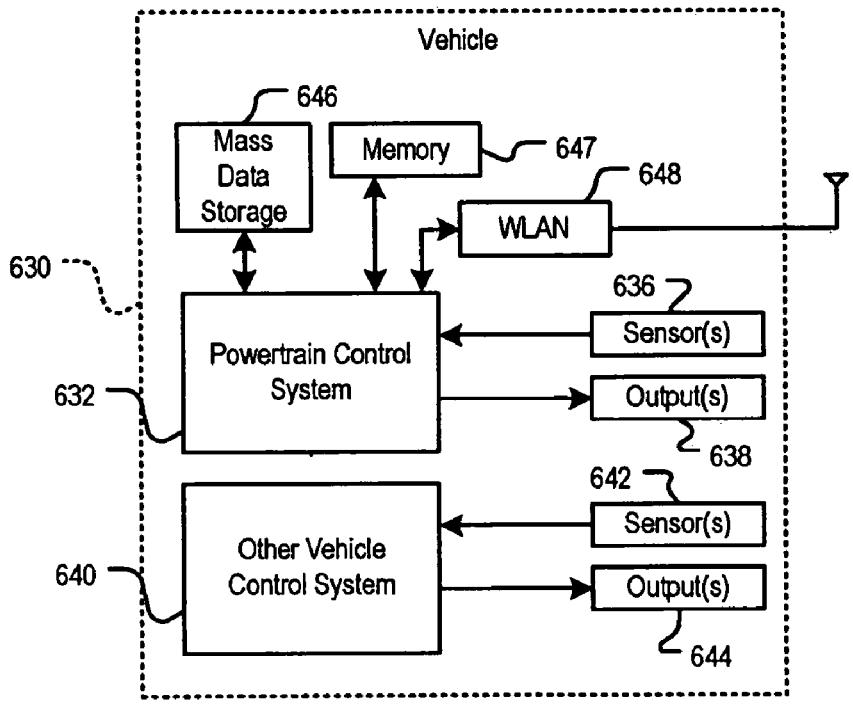

Referring now to FIG. 6D, the present invention implements a control system of a vehicle 630, a WLAN interface and/or mass data storage of the vehicle control system. In some implementations, the present invention implements a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The control system 640 may also include mass data storage, memory and/or a WLAN interface (all not shown).

Figure 6E:
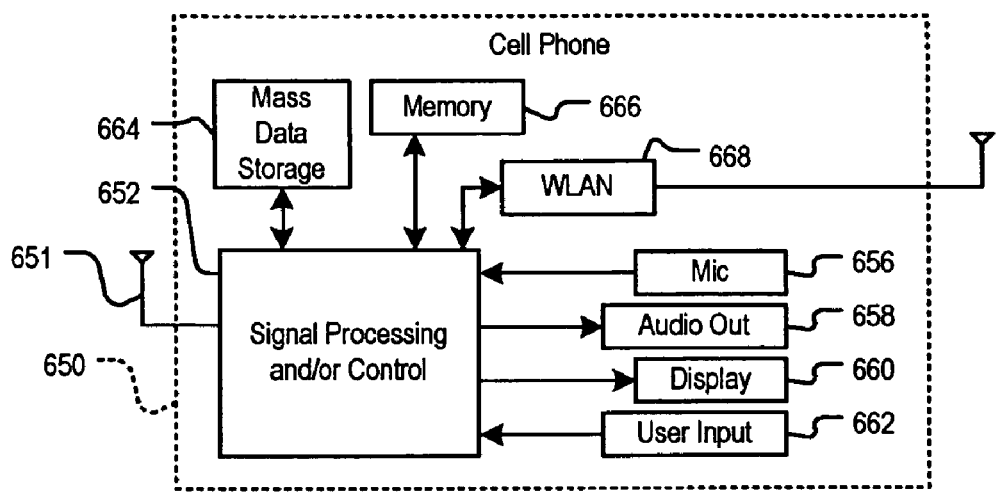

Referring now to FIG. 6E, the present invention may be embodied in a cellular phone 650 that may include a cellular antenna 651. The present invention may implement either or both signal processing and/or control circuits, which are generally identified in FIG. 6E at 652, a WLAN interface and/or mass data storage of the cellular phone 650. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage.

Cellular phone 650 also may support connections with a WLAN via a WLAN network interface 668.

Figure 6F:
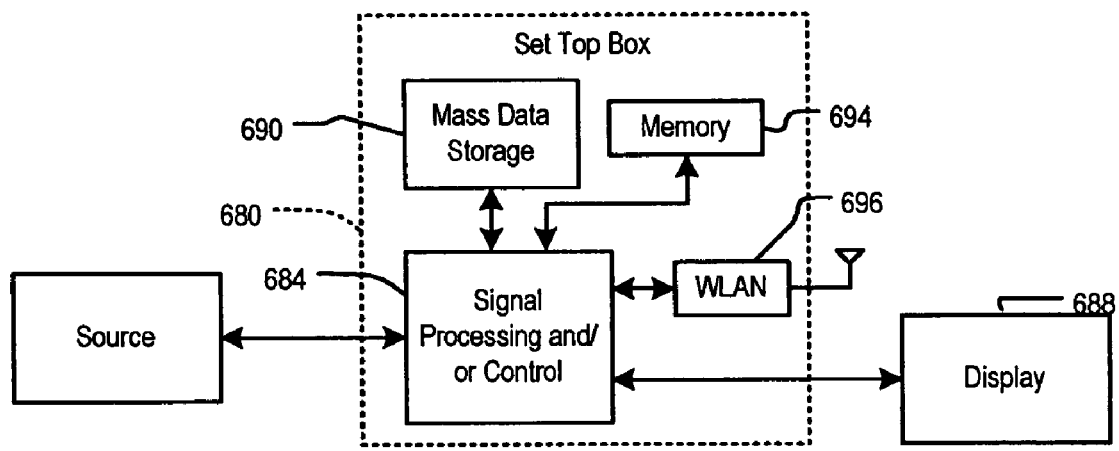

Referring now to FIG. 6F, the present invention may be embodied in a set top box 680. The present invention may implement either or both signal processing and/or control circuits, which are generally identified in FIG. 6F at 684, a WLAN interface and/or mass data storage of the set top box 680. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696.

Figure 6G:
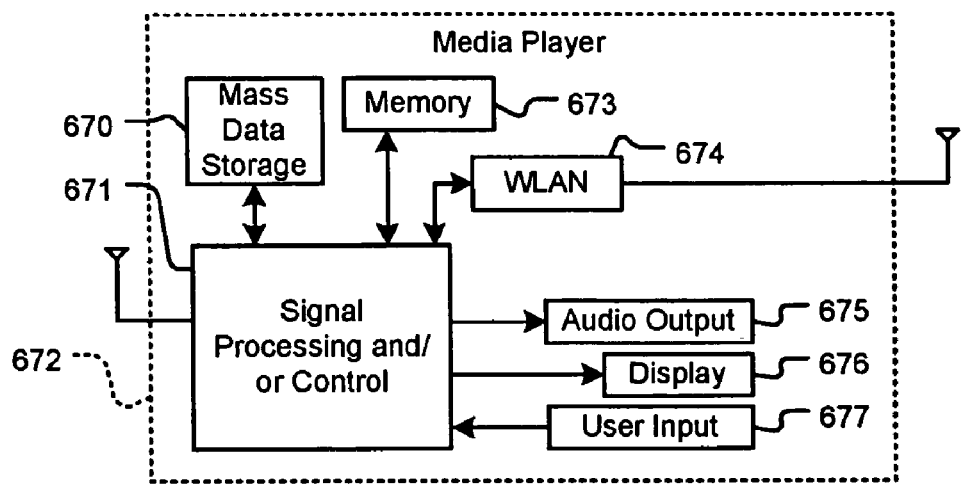

Referring now to FIG. 6G, the present invention may be embodied in a media player 672. The present invention may implement either or both signal processing and/or control circuits, which are generally identified in FIG. 6G at 671, a WLAN interface and/or mass data storage of the media player 672. In some implementations, media player 672 includes a display 676 and/or a user input 677 such as a keypad, touchpad and the like. In some implementations, media player 672 may employ a graphical user interface (GUI) that typically employs menus, drop down menus, icons and/or a point-and-click interface via display 676 and/or user input 677. Media player 672 further includes an audio output 675 such as a speaker and/or audio output jack. Signal processing and/or control circuits 671 and/or other circuits (not shown) of media player 672 may process data, perform coding and/or encryption, perform calculations, format data and/or perform any other media player function.

Media player 672 may communicate with mass data storage 670 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Media player 672 may be connected to memory 673 such as RAM, ROM, low latency nonvolatile memory such as flash memory and/or other suitable electronic data storage. Media player 672 also may support connections with a WLAN via a WLAN network interface 674.

Figure 6H:
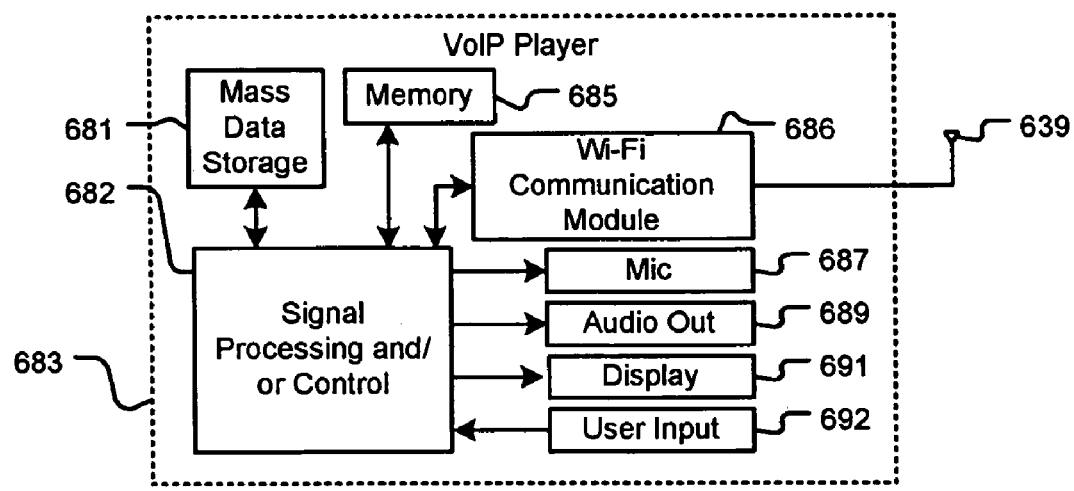

Referring to FIG. 6H, the present invention may be embodied in a Voice over Internet Protocol (VoIP) phone 683 that may include an antenna 639. The present invention may implement either or both signal processing and/or control circuits, which are generally identified in FIG. 6H at 682, a wireless interface and/or mass data storage of the VoIP phone 683. In some implementations, VoIP phone 683 includes, in part, a microphone 687, an audio output 689 such as a speaker and/or audio output jack, a display monitor 691, an input device 692 such as a keypad, pointing device, voice actuation and/or other input devices, and a Wireless Fidelity (Wi-Fi) communication module 686. Signal processing and/or control circuits 682 and/or other circuits (not shown) in VoIP phone 683 may process data, perform coding and/or encryption, perform calculations, format data and/or perform other VoIP phone functions.

VoIP phone 683 may communicate with mass data storage 602 that stores data in a nonvolatile manner such as optical and/or magnetic storage devices, for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". VoIP phone 683 may be connected to memory 685, which may be a RAM, ROM, low latency nonvolatile memory such as flash memory and/or other suitable electronic data storage. VoIP phone 683 is configured to establish communications link with a VoIP network (not shown) via Wi-Fi communication module 686. Still other implementations in addition to those described above are contemplated.

It is to be understood that the exemplary embodiments described above are for illustrative purposes and that various modifications or changes in light thereof will be suggested to persons skilled in the art and are to be included within the spirit and purview of this application and scope of the appended claims. For example, while the circuit has been described as an integrated circuit, the circuit may be implemented in an integrated circuit and one or more discrete components, or in all discrete components. Further, while the foregoing description refers to various voltage as being higher then other voltages (e.g., voltages for CMOS logic), the circuit may be implemented in other circuit logic (e.g., ECL) in which applied voltage values may be changed as will be readily understood by those of skill in the art. Therefore, the above description should not be understood as limiting the scope of the invention as defined by the claims.

What is claimed is:

1. A programmable capacitance circuit comprising:
   an input node;
   an output node; and
   a plurality of capacitance stages, wherein each of the capacitance stages is coupled to the input node and the output node, and wherein each capacitance stage is configured to be switched into a circuit path between the input node and the output node and includes:
      a capacitor, and
      a control transistor having a gate capacitance in series with the capacitor, the control transistor including a first source-drain node coupled to a voltage source, a second source-drain node coupled to a first node of the capacitor, and a gate node coupled to the input node; and wherein the gate capacitance is configured to be added to the capacitance between the input node and the output node.

2. The programmable capacitance circuit of claim 1, wherein the gate capacitance is configured to be added to the capacitance of the capacitor between the input node and the output node.

3. The programmable capacitance circuit of claim 1, wherein the capacitor of each capacitance stage includes a second node coupled to the output node.

4. The programmable capacitance circuit of claim 3, further comprising a current source, wherein each capacitance stage further includes a set of switches coupled to the current source and configured to selectively route the current to turn on an associated one of the control transistors.

5. The programmable capacitance circuit of claim 4, wherein each set of switches includes a pair of switches in series between the current source and ground, and a current-control transistor including i) a gate node coupled to a node between the pair of switches, ii) a first source-drain node coupled to the second source-drain node of the control transistor and to the first node of the capacitor, and iii) a second source-drain node coupled to ground.

6. The programmable capacitance circuit of claim 5, wherein each current-control transistor of each capacitance stage is configured to turn on the control transistor of the capacitance stage if the current-control transistor is turned on by the current source.

7. The programmable capacitance circuit of claim 5, further comprising a shunt transistor configured to shunt current from the current source to ground if each pair of switches is open.

8. The programmable capacitance circuit of claim 7, wherein the shunt transistor includes a gate node and a first source-drain node coupled to the current source, and a second source-drain node coupled to ground.

9. The programmable capacitance circuit of claim 8, wherein the input node and the output node are configured to be coupled across one or more amplification stages of a multi-stage amplifier.

10. The programmable capacitance circuit of claim 1, wherein one or more of the capacitors have the same capacitance.

11. The programmable capacitance circuit of claim 1, wherein the capacitors have different capacitances.

12. The programmable capacitance circuit of claim 1, wherein the gate capacitance of each control transistor of each capacitance stage is substantially the same as the capacitance of the capacitor of the capacitance stage.

13. The programmable capacitance circuit of claim 1, wherein the capacitor of each capacitance stage is coupled between the control transistor of the capacitance stage and the output node.

14. A programmable circuit comprising:
an amplifier having a set of amplifier stages; and
a programmable capacitance circuit having a plurality of capacitance stages coupled across at least one of the amplifier stages, wherein each capacitance stage is configured to be switched into a circuit path across the at least one amplifier stage, and wherein each capacitance stage includes a capacitor, and a control transistor having a gate capacitance in series with the capacitor, wherein the control transistor includes a first source-drain node coupled to a voltage source, a second source-drain node coupled to a first node of the capacitor, and a gate node coupled to a first voltage node of the amplifier.

15. The circuit of claim 14, wherein the capacitance across the at least one amplifier stage is the gate capacitance plus the capacitance of the capacitor added serially.

16. The circuit of claim 14, wherein the capacitor of each capacitance stage includes a second node coupled to a second voltage node of the amplifier.

17. The circuit of claim 16, wherein a first voltage at the second voltage node is an amplified voltage of a second voltage at the first voltage node.

18. The circuit of claim 17, wherein the at least one stage is configured to amplify the first voltage to the second voltage.

19. The circuit of claim 16, further comprising a current source, wherein each capacitance stage further includes a set of switches configured to selectively route the current to turn on an associated one of the control transistors.

20. The circuit of claim 19, wherein each set of switches includes a pair of switches in series between the current source and ground, and a current-control transistor including i) a gate node coupled to a node between the pair of switches, ii) a first source-drain node coupled to the second source-drain node of the control transistor and to the first node of the capacitor, and iii) a second source-drain node coupled to ground.

21. The circuit of claim 20, wherein each current-control transistor of each capacitance stage is configured to turn on the control transistor of the capacitance stage if the current-control transistor is turned on by the current source.

22. The circuit of claim 21, further comprising a shunt transistor configured to shunt current from the current source to ground if each current-control transistor of each capacitance stage is off.

23. The circuit of claim 22, wherein the shunt transistor includes a gate node and a first source-drain node coupled to the current source, and a second source-drain node coupled to ground.

24. The circuit of claim 14, wherein one or more of the capacitors have the same capacitance.

25. The circuit of claim 14, wherein the capacitors have different capacitances.

26. The circuit of claim 14, wherein the gate capacitance is substantially the same as the capacitance of the capacitor.

27. A programmable circuit method comprising:
coupling a programmable capacitance circuit across first and second voltage nodes of a circuit, wherein the first and second voltage nodes have different voltages; and
switching at least one capacitance stage of the programmable capacitance circuit into a circuit path across the first and second voltage nodes, wherein the capacitance of the at least one capacitance stage includes the gate capacitance of a transistor and the capacitance of a capacitor, and wherein the transistor includes a first source-drain node coupled to a voltage source, a second source-drain node coupled to a first node of the capacitor, and a gate node coupled to one of the first or second voltage nodes.

28. The method of claim 27, wherein the gate capacitance of the transistor and the capacitance of the capacitor is series capacitance.

29. The method of claim 27, wherein at least one of the first and second voltage nodes is an amplifier node of an amplifier having a plurality of amplifier stages.

* * * * *